US009857504B2

(12) United States Patent
Hirayama et al.

(10) Patent No.: US 9,857,504 B2
(45) Date of Patent: Jan. 2, 2018

(54) OPTICAL WAVEGUIDE PHOTOSENSITIVE RESIN COMPOSITION, PHOTOCURABLE FILM FOR FORMING OPTICAL WAVEGUIDE CORE LAYER, OPTICAL WAVEGUIDE USING SAME, AND MIXED FLEXIBLE PRINTED CIRCUIT BOARD FOR OPTICAL/ELECTRICAL TRANSMISSION

(71) Applicant: NITTO DENKO CORPORATION, Ibaraki-shi, Osaka (JP)

(72) Inventors: Tomoyuki Hirayama, Ibaraki (JP); Yuichi Tsujita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 27 days.

(21) Appl. No.: 15/028,567

(22) PCT Filed: Oct. 24, 2014

(86) PCT No.: PCT/JP2014/078333
§ 371 (c)(1),
(2) Date: Apr. 11, 2016

(87) PCT Pub. No.: WO2015/068592
PCT Pub. Date: May 14, 2015

(65) Prior Publication Data
US 2016/0252655 A1 Sep. 1, 2016

(30) Foreign Application Priority Data
Nov. 8, 2013 (JP) .................................. 2013-231728

(51) Int. Cl.
| | |
|---|---|
| G02B 6/10 | (2006.01) |
| G02B 1/04 | (2006.01) |
| G02B 6/122 | (2006.01) |
| G02B 6/138 | (2006.01) |
| G03F 7/00 | (2006.01) |
| G03F 7/038 | (2006.01) |
| C08G 59/24 | (2006.01) |
| C08G 59/32 | (2006.01) |
| C08G 59/38 | (2006.01) |
| C08G 59/70 | (2006.01) |

(52) U.S. Cl.
CPC ........... *G02B 1/046* (2013.01); *C08G 59/245* (2013.01); *C08G 59/3218* (2013.01); *C08G 59/38* (2013.01); *C08G 59/70* (2013.01); *G02B 1/045* (2013.01); *G02B 6/1221* (2013.01); *G02B 6/138* (2013.01); *G03F 7/0005* (2013.01); *G03F 7/038* (2013.01)

(58) Field of Classification Search
CPC ...... G02B 1/046; G02B 1/045; G02B 6/1221; G02B 6/138; G03F 7/005; G03F 7/038; C08G 59/245; C08G 59/3218; C08G 59/38; C08G 59/70
See application file for complete search history.

(56) References Cited

U.S. PATENT DOCUMENTS

| | | | |
|---|---|---|---|
| 9,488,911 B2 * | 11/2016 | Tsuchimura | ......... C07D 277/64 |
| 2004/0076391 A1 | 4/2004 | Ghoshal et al. | |
| 2005/0265685 A1 | 12/2005 | Ohashi et al. | |
| 2007/0041698 A1 | 2/2007 | Maeda et al. | |
| 2009/0046986 A1 | 2/2009 | Maeda et al. | |
| 2011/0044597 A1 | 2/2011 | Maeda et al. | |
| 2015/0166780 A1 * | 6/2015 | Arayama | ................. C08K 9/04 522/39 |
| 2015/0166783 A1 * | 6/2015 | Arayama | ............. G03F 7/0047 522/39 |
| 2015/0166816 A1 * | 6/2015 | Arayama | ................. C09D 4/00 524/556 |

FOREIGN PATENT DOCUMENTS

| | | |
|---|---|---|
| CN | 101305047 A | 11/2008 |
| JP | 2001-281475 A | 10/2001 |
| JP | 2007-52120 A | 3/2007 |
| JP | 2009-15085 A | 1/2009 |
| JP | 2010-78924 A | 4/2010 |
| JP | 2010-84150 A | 4/2010 |

(Continued)

OTHER PUBLICATIONS

Notification of Transmittal of Translation of the International Preliminary Report on Patentability (Form PCT/IB/338) issued in counterpart International Application No. PCT/JP20141078333 dated May 19, 2016 with Forms PCT/IB/373 and PCT/ISA/237. (14 pages).
Office Action dated Dec. 29, 2016, issued in counterpart Chinese Patent Application No. 201480053547.6, with English translation. (10 pages).
Office Action dated Jun. 6, 2017, issued in counterpart Japanese Patent Application No. 2013-231728, with English translation. (9 pages).
International Search Report dated Jan. 6, 2015, issued in counterpart International Application No. PCT/JP2014/078333 (2 pages).

(Continued)

*Primary Examiner* — Thomas A Hollweg
*Assistant Examiner* — Guy Anderson
(74) *Attorney, Agent, or Firm* — Westerman, Hattori, Daniels & Adrian, LLP

(57) ABSTRACT

An optical waveguide photosensitive resin composition containing an aliphatic resin having a polymerizable substituent and a photopolymerization initiator, in which the aliphatic resin having the polymerizable substituent is formed of a side-chain polyfunctional aliphatic resin (A) and a bifunctional long-chain aliphatic resin (B), is provided. Accordingly, the composition brings together high transparency, satisfactory roll-to-roll compatibility, and a high resolution patterning property, and has excellent reflow resistance. Therefore, the composition is useful as a material for forming an optical waveguide, especially a core layer-forming material.

11 Claims, No Drawings

(56) References Cited

FOREIGN PATENT DOCUMENTS

| | | |
|---|---|---|
| JP | 2010-230944 A | 10/2010 |
| JP | 2010-243920 A | 10/2010 |
| JP | 2011-27903 A | 2/2011 |
| JP | 2011-209664 A | 10/2011 |
| JP | 2011-221226 A | 11/2011 |
| JP | 2011-237645 A | 11/2011 |
| WO | 2007/055134 A1 | 5/2007 |
| WO | 2010/110495 A1 | 9/2010 |

OTHER PUBLICATIONS

Office Action dated Nov. 7, 2017, issued in counterpart Japanese Application No. 2013-231728, with machine translation. (6 pages).

* cited by examiner

OPTICAL WAVEGUIDE PHOTOSENSITIVE RESIN COMPOSITION, PHOTOCURABLE FILM FOR FORMING OPTICAL WAVEGUIDE CORE LAYER, OPTICAL WAVEGUIDE USING SAME, AND MIXED FLEXIBLE PRINTED CIRCUIT BOARD FOR OPTICAL/ELECTRICAL TRANSMISSION

TECHNICAL FIELD

The present invention relates to an optical waveguide photosensitive resin composition and a photocurable film for forming an optical waveguide core layer each of which is to be used as a material for forming, for example, a core layer constituting an optical waveguide in a mixed flexible printed circuit board for optical/electrical transmission to be widely used in optical communication, optical information processing, and any other general optics, an optical waveguide using the composition or the film, and a mixed flexible printed circuit board for optical/electrical transmission.

BACKGROUND ART

A mixture formed of liquid photosensitive monomers has heretofore been used as an optical waveguide core layer-forming material intended for a mixed flexible printed circuit board for optical/electrical transmission, and in formation of the pattern of a core layer using the mixture, a desired core pattern has been produced by performing ultraviolet (UV) irradiation through a photomask. Such mixture formed of the photosensitive monomers has high photocuring sensitivity. On the other hand, when the mixture is subjected to a continuous process like a roll-to-roll (R-to-R) process serving as a production process bringing mass production into perspective from the viewpoint of surface stickiness (tackiness) after its application, a film formed of the mixture is broken upon its contact with a roll. Accordingly, the mixture has a drawback in that the mixture cannot be compatible with the R-to-R process, and hence involves a problem in that the mixture is poor in productivity (Patent Literature 1).

Accordingly, a polymer material that is solid at normal temperature has been generally used as a photosensitive resin in order to be compatible with a continuous process like the R-to-R process. At that time, as the molecular weight of the polymer material becomes higher, the flexibility of an amorphous film serving as a stage before its curing improves. On the other hand, the material involves a problem in that the patterning resolution (curing sensitivity) of the film reduces as the molecular weight becomes higher. In contrast, as the molecular weight of the polymer material becomes lower, the patterning resolution improves but the flexibility reduces. As described above, the flexibility and patterning resolution of the film are generally in a trade-off relationship, and the relationship has been perceived as a problem. In view of the foregoing, such an optical waveguide core layer-forming material that compatibility between the flexibility and patterning resolution of a photosensitive curable film is achieved has been required, and various kinds of such materials have been proposed (Patent Literature 2).

The optical waveguide core layer-forming material needs to satisfy many required characteristics, such as a high refractive index, high transparency, a high resolution patterning property, and high heat resistance, serving as various physical properties of a cured product in accordance with its use applications. Accordingly, investigations for satisfying the characteristics through, for example, the selection of various raw materials and blending balance have been made.

As described in the foregoing, in order that the optical waveguide core layer-forming material may be subjected to the R-to-R process bringing mass production into perspective, an approach involving turning an uncured film formed of the forming material into a dry film has been generally used. However, the approach leads to a reduction in degree of freedom in material design in material development owing to requirements for the process compatibility of the material for the dry film, such as the low tackiness and flexibility of the uncured product. In addition, when the dry film is produced, laminate base materials are needed for both surfaces of the film, and the need becomes a problem from the viewpoints of resource savings and a cost. Accordingly, in the material development, emphasis has also been placed on compatibility to a wet process and the compatibility has been investigated (Patent Literature 3).

In view of such background, there has been proposed, for example, a photosensitive resin composition satisfying the characteristics as a result of the blending of a special novolac-type polyfunctional epoxy resin serving as a main agent with various resins (Patent Literature 4).

RELATED ART DOCUMENT

Patent Document

[PTL 1] JP-A-2001-281475
[PTL 2] JP-A-2011-27903
[PTL 3] JP-A-2010-230944
[PTL 4] JP-A-2011-237645

SUMMARY OF INVENTION

However, a waveguide material intended for a mixed flexible printed circuit board for optical/electrical transmission is required to have particularly high transparency and reflow resistance for being capable of resisting a solder reflow step in a production process out of the required characteristics.

In view of the foregoing, a photosensitive curable resin composition that can be an optical waveguide core layer-forming material bringing together high transparency and reflow resistance while maintaining conventional R-to-R compatibility and a conventional high resolution patterning property has been strongly demanded.

The present invention has been made in view of such circumstances, and an object of the present invention is to provide an optical waveguide photosensitive resin composition and a photocurable film for forming an optical waveguide core layer each serving as a material for forming an optical waveguide, especially a core layer-forming material bringing together high transparency, satisfactory R-to-R compatibility, and a high resolution patterning property, and having excellent reflow resistance, an optical waveguide using the composition or the film, and a mixed flexible printed circuit board for optical/electrical transmission.

In order to achieve the above-mentioned object, a first aspect of the present invention resides in an optical waveguide photosensitive resin composition, including: an aliphatic resin having a polymerizable substituent; and a photopolymerization initiator, in which the aliphatic resin having the polymerizable substituent is formed of the following (A) and (B):

(A) a side-chain polyfunctional aliphatic resin; and
(B) a bifunctional long-chain aliphatic resin.

Further, a second aspect of the present invention resides in a photocurable film for forming an optical waveguide core layer, which is obtained by forming the optical waveguide photosensitive resin composition of the first aspect into a film shape.

Further, a third aspect of the present invention resides in an optical waveguide, including: a base material; a cladding layer formed on the base material; and a core layer configured to propagate an optical signal, the core layer being formed in the cladding layer in a predetermined pattern, in which the core layer is formed by curing the optical waveguide photosensitive resin composition of the first aspect or the photocurable film for forming an optical waveguide core layer of the second aspect.

Further, a fourth aspect of the present invention resides in a mixed flexible printed circuit board for optical/electrical transmission, including the optical waveguide of the third aspect.

The inventors of the present invention have made extensive investigations for obtaining a photosensitive resin composition serving as an optical waveguide core layer-forming material bringing together high transparency, satisfactory R-to-R compatibility, and a high resolution patterning property, and having excellent reflow resistance. As a result, the inventors have found that the desired object is achieved by using a photosensitive epoxy resin composition having the blended components described above, and thus have reached the present invention.

That is, with regard to [1] tackiness, the tackiness results from the presence of a liquid resin in a resin component serving as a blended component, and hence the tackiness is alleviated by adopting, as resin components, blending design formed only of the side-chain polyfunctional aliphatic resin (A) and the bifunctional long-chain aliphatic resin (B) serving as solid resin components. In addition, with regard to [2] R-to-R compatibility, the compatibility depends on the flexibility of a coating film after its application and drying under normal temperature, and hence flexibility is imparted to an amorphous film when the film is uncured during film (layer) formation by constituting the film according to a blending setting showing a solid resin at normal temperature. In particular, in the present invention, when a mixing weight ratio between the side-chain polyfunctional aliphatic resin (A) and the bifunctional long-chain aliphatic resin (B) deviates from a specific range, and for example, the amount of the side-chain polyfunctional aliphatic resin (A) increases, the following tendency is observed: the flexibility of the uncured amorphous film significantly deteriorates and hence the R-to-R compatibility deteriorates. With regard to [3] a patterning property, an improvement in patterning property is achieved by: using the side-chain polyfunctional aliphatic resin (A) having a particularly high curing rate as a main agent in association with photocuring; and adjusting its formulation so that the other required physical properties may not be inhibited. In particular, in the present invention, when the mixing weight ratio between the side-chain polyfunctional aliphatic resin (A) and the bifunctional long-chain aliphatic resin (B) deviates from the specific range, and for example, the amount of the bifunctional long-chain aliphatic resin (B) increases, the following tendency is observed: the patterning property and heat resistance of the composition significantly deteriorate, and hence the loss of a waveguide worsens.

In view of the foregoing, the use of the optical waveguide photosensitive resin composition obtained by setting the blending of the resins as described above brings together low tackiness, satisfactory R-to-R compatibility, and a high resolution patterning property, and provides excellent high transparency (low loss) and excellent reflow resistance. Thus, the inventors have reached the present invention.

It should be noted that with regard to the high transparency (low loss), the high transparency results from a resin skeleton to be used and a related-art core layer-forming material is required to have a refractive index higher than that of a cladding layer, and hence an aromatic skeleton-containing resin is used in terms of its design. However, the waveband of propagating light having a wavelength of 850 nm overlaps the tailing of the fourth harmonic absorption ($4v_{CH}$) of vibration absorption derived from a C—H bond of an aromatic ring owing to the presence of the aromatic skeleton, and hence there has been a limitation on the reduction of a loss equal to or more than a certain level. In the present invention, in a core layer-forming material, material design eliminating an influence of the fourth harmonic absorption ($4v_{CH}$) derived from the aromatic ring has been achieved by constituting the core layer-forming material through the use of an aliphatic resin free of an aromatic ring.

In addition, it is possible to correspond to the high transparency (low loss) in an additionally suitable manner by selecting, for example, a cation skeleton in a photoacid generator. That is, the mechanism via which the heat deterioration (coloring) of a cured product occurs is derived from the occurrence of a π-conjugated extension factor caused by the oxidation deterioration of a resin. As a guideline on the selection of a photoacid generator in the blending design of a photocurable resin, a photoacid generator having a cation skeleton (e.g., a triphenylsulfonium salt-based skeleton) having a relatively wide π-conjugated system to which sensitivity to an exposure wavelength of 365 nm is imparted has heretofore been adopted from the viewpoint of the patterning property. However, the wide π-conjugated skeleton is a factor for the fact that the coloring is liable to occur owing to the extension of the π-conjugated system in the oxidation deterioration of a cation residue (dead body) after the generation of an acid. Accordingly, it is additionally suitable to use a photoacid generator formed of a narrow π-conjugated cation portion like a diphenyliodonium cation-based photoacid generator for the high transparency (low loss).

In the present invention, the diphenyliodonium cation-based photoacid generator is used because of the following reason. The specific photoacid generator is one of the photoacid generators each constituted of the narrowest π-conjugated system out of all photoacid generators. Accordingly, the photoacid generator has no sensitivity to an exposure wavelength of 365 nm, and hence mixed beam exposure (broad light) is needed. However, a cured product to be obtained is less liable to color than a cured product using the triphenylsulfonium salt-based photoacid generator that has heretofore been used is, and hence additionally satisfactory high transparency (low loss) can be imparted.

Meanwhile, with regard to the reflow resistance, in addition to the selection of, in particular, a material exhibiting a suppressing effect on yellowing due to heating as a core portion-forming material, it is additionally suitable to use an antimony-based photoacid generator excellent in property by which the yellowing of a resin is prevented after its exposure as a photoacid generator because an additional effect is imparted.

As described above, the present invention is the optical waveguide photosensitive resin composition containing: the aliphatic resin having the polymerizable substituent formed of the side-chain polyfunctional aliphatic resin (A) and the bifunctional long-chain aliphatic resin (B); and the photopolymerization initiator. Accordingly, for example, when the core layer of an optical waveguide is formed by using the optical waveguide photosensitive resin composition, the core layer of the optical waveguide reduced in loss and excellent in reflow resistance can be formed by an applying step and a R-to-R process without the change of a conventional production process.

In addition, the use of a photoacid generator represented by the general formula (1) to be described later as the photopolymerization initiator imparts additionally excellent high transparency (low loss), and imparts additionally excellent reflow resistance.

DESCRIPTION OF EMBODIMENTS

Next, an embodiment of the present invention is described in detail. However, the present invention is not limited to the embodiment.

<<Optical Waveguide Photosensitive Resin Composition>>

An optical waveguide photosensitive resin composition (hereinafter sometimes simply referred to as "photosensitive resin composition") of the embodiment of the present invention is obtained by using an aliphatic resin having a polymerizable substituent and a photopolymerization initiator. In addition, in the embodiment of the present invention, the aliphatic resin having the polymerizable substituent is characterized by being formed of a side-chain polyfunctional aliphatic resin (A) and a bifunctional long-chain aliphatic resin (B). It should be noted that in the present invention, the term "liquid" or "solid" means that a substance shows a "liquid" or "solid" state at a normal temperature of 25° C.

Various components are sequentially described below.

<Aliphatic Resin having Polymerizable Substituent>

The aliphatic resin having the polymerizable substituent is constituted of the side-chain polyfunctional aliphatic resin (A) and the bifunctional long-chain aliphatic resin (B). In addition, the aliphatic resin having the polymerizable substituent preferably shows a solid state at normal temperature. It should be noted that in the embodiment of the present invention, the aliphatic resin having the polymerizable substituent is preferably a resin whose entirety shows a solid state at normal temperature, but may be blended with an aliphatic resin showing a liquid state at normal temperature to the extent that the effects of the embodiment of the present invention are not impaired (e.g., at a content of about 5 wt % or less of the entirety of the photosensitive resin composition).

The side-chain polyfunctional aliphatic resin (A) is an aliphatic resin having two or more functional groups on side chains thereof, and examples thereof include polyfunctional aliphatic epoxy resins, such as a 1,2-epoxy-4-(2-oxiranyl) cyclohexane adduct of 2,2-bis(hydroxymethyl)-1-butanol. One kind of those resins is used alone, or two or more kinds thereof are used in combination. The resin is specifically, for example, EHPE 3150 (manufactured by Daicel Corporation). In addition, the side-chain polyfunctional aliphatic resin (A) preferably shows a solid state, and the term "solid" in this case means that the resin shows a solid state at normal temperature (25° C.) as described above.

In addition, the polymerizable substituent is present in the side-chain polyfunctional aliphatic resin (A), and the polymerizable substituent is preferably a cationically polymerizable substituent. Examples of the cationically polymerizable substituent include an epoxy group, an epoxy group having an alicyclic skeleton, and a substituent having an oxetane skeleton.

The bifunctional long-chain aliphatic resin (B) is, for example, a long-chain aliphatic epoxy resin having epoxy groups serving as polymerizable functional groups at both of its terminals. The use of the long-chain aliphatic epoxy resin as described above can reduce a crosslink density in cationic polymerization and hence can impart flexibility to a cured product. Examples thereof include a hydrogenated bisphenol A-type epoxy resin and a hydrogenated bisphenol F-type epoxy resin that are free of an aromatic ring. One kind of those resins is used alone, or two or more kinds thereof are used in combination. Specific examples thereof include YX-8040 (manufactured by Mitsubishi Chemical Corporation) and ST-4000D (manufactured by Nippon Steel Chemical Co., Ltd.). As described above, in the embodiment of the present invention, the alicyclic epoxy resin is meant to be included as the aliphatic resin. In addition, the bifunctional long-chain aliphatic resin (B) preferably shows a solid state, and the term "solid" in this case means that the resin shows a solid state at normal temperature (25° C.) as described above. In addition, the same effect as that described above can be exhibited by using an aliphatic resin free of an epoxy group, i.e., an aliphatic resin exhibiting an action as a binder resin instead of the long-chain aliphatic epoxy resin.

A mixing weight ratio [(A):(B)] between the side-chain polyfunctional aliphatic resin (A) and the bifunctional long-chain aliphatic resin (B) preferably satisfies a relationship of (A):(B)=4:1 to 1:1, and particularly preferably satisfies a relationship of (A):(B)=3:1 to 2:1. When the mixing weight ratio deviates from the range and the amount of the (A) is excessively large, the following tendency is observed: an amorphous film before its curing becomes brittle and cannot resist bending by an axis in a R-to-R process, and hence a crack occurs. In addition, when the amount of the (A) is excessively small, the following tendency is observed: the patterning property of the composition deteriorates in photocuring or heat curing.

<Photopolymerization Initiator>

The photopolymerization initiator is used for imparting curability by light irradiation to the photosensitive resin composition, e.g., for imparting ultraviolet curability.

For example, the following photopolymerization initiator is suitably used as the photopolymerization initiator: triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfonium hexafluoroantimonate, bis[4-(diphenylsulfonio)phenyl]sulfide bishexafluorophosphate, bis[4-(diphenylsulfonio)phenyl]sulfide bishexafluoroantimonate, (2,4-cyclopentadien-1-yl)[(1-methylethyl)benzene]-Fe-hexafluorophosphate, or diphenyliodonium hexafluoroantimonate. One kind of those initiators is used alone, or two or more kinds thereof are used in combination. Of those, a photoacid generator represented by the following general formula (1) is preferably used in terms of the impartment of high transparency (low loss) and an improvement in reflow resistance.

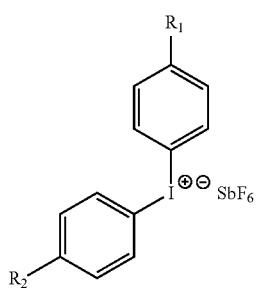

(1)

In the formula (1), $R_1$ and $R_2$ each represent hydrogen or an alkyl group having 1 to 15 carbon atoms, and may be identical to or different from each other.

In the formula (1), $R_1$ and $R_2$ each represent preferably an alkyl group having 1 to 15 carbon atoms, particularly preferably a mixture having an alkyl group having 10 to 13 carbon atoms. The photoacid generator is specifically, for example, an iodonium salt-type photopolymerization initiator, such as WPI-116 (manufactured by Wako Pure Chemical Industries, Ltd.).

The content of the photopolymerization initiator is set to preferably from 0.1 part by weight to 3 parts by weight, more preferably from 0.5 part by weight to 1 part by weight with respect to 100 parts by weight of the resin component of the photosensitive resin composition (e.g., the aliphatic resin having the polymerizable substituent). That is, when the content of the photopolymerization initiator is excessively small, satisfactory photocurability by which the composition is cured through light irradiation (ultraviolet irradiation) is hardly obtained. When the content is excessively large, the following tendency is observed: the photosensitivity of the composition rises and hence its shape becomes abnormal upon its patterning. In addition, the following tendency is observed: a required physical property concerning an initial loss deteriorates.

For example, the following additives are given as an additive to be used as required in the photosensitive resin composition of the embodiment of the present invention in addition to the aliphatic resin having the polymerizable substituent and the photopolymerization initiator: adhesiveness-imparting agents for enhancing an adhesive property, such as a silane-based or titanium-based coupling agent, an olefin-based oligomer, a cycloolefin-based oligomer or polymer, e.g., a norbornene-based polymer, synthetic rubber, and a silicone compound; various antioxidants, such as a hindered phenol-based antioxidant and a phosphorus-based antioxidant; a leveling agent; and an antifoaming agent. Those additives are each appropriately blended to the extent that the effects in the present invention are not impaired. One kind of those additives can be used alone, or two or more kinds thereof can be used in combination.

The blending amount of the antioxidant is set to preferably less than 3 parts by weight, particularly preferably 1 part by weight or less with respect to 100 parts by weight of the resin component of the photosensitive resin composition (e.g., the aliphatic resin having the polymerizable substituent). That is, when the content of the antioxidant is excessively large, the following tendency is observed: the required physical property concerning the initial loss deteriorates.

The photosensitive resin composition of the embodiment of the present invention can be prepared by stirring and mixing the aliphatic resin having the polymerizable substituent and the photopolymerization initiator, and as required, any other additive at predetermined blending ratios. Further, the materials may be stirred and dissolved in an organic solvent under heating (e.g., at from about 60° C. to about 90° C.) so that the photosensitive resin composition of the embodiment of the present invention may be prepared as a varnish for application. The usage amount of the organic solvent, which is appropriately adjusted, is set to, for example, preferably from 20 parts by weight to 80 parts by weight, particularly preferably from 30 parts by weight to 50 parts by weight with respect to 100 parts by weight of the resin component of the photosensitive resin composition (e.g., the aliphatic resin having the polymerizable substituent). That is, when the usage amount of the organic solvent is excessively small, the following tendency is observed: the viscosity of the composition prepared as the varnish for application increases and hence its applicability reduces. When the usage amount of the organic solvent is excessively large, the following tendency is observed: it becomes difficult to apply and form the varnish for application into a thick film.

Examples of the organic solvent to be used in preparing the varnish for application include ethyl lactate, methyl ethyl ketone, cyclohexanone, ethyl lactate, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents is used alone, or two or more kinds thereof are used in combination, in, for example, a predetermined amount in the above-mentioned range so that viscosity suitable for application may be obtained.

<<Optical Waveguide>>

Next, an optical waveguide obtained by using the photosensitive resin composition of the present invention as a material for forming its core layer is described.

The optical waveguide obtained by the embodiment of the present invention includes, for example: a base material; a cladding layer (undercladding layer) formed on the base material in a predetermined pattern; a core layer configured to propagate an optical signal, the core layer being formed on the cladding layer in a predetermined pattern; and a cladding layer (overcladding layer) formed on the core layer. In addition, the optical waveguide obtained by the embodiment of the present invention is characterized in that the core layer is formed of the photosensitive resin composition. In addition, with regard to a material for forming the undercladding layer and a material for forming the overcladding layer, resin compositions for forming cladding layers formed of the same component composition may be used, or resin compositions of different component compositions may be used. It should be noted that in the optical waveguide obtained by the embodiment of the present invention, the cladding layers each need to be formed so as to have a refractive index smaller than that of the core layer.

In the embodiment of the present invention, the optical waveguide can be produced through, for example, the following steps. That is, the base material is prepared and a photosensitive varnish formed of a photosensitive resin composition serving as a cladding layer-forming material is applied onto the base material. The photosensitive varnish is cured by irradiating the varnish-applied surface with light, such as ultraviolet light, and subjecting the surface to a heat treatment as required. Thus, the undercladding layer (the lower portion of the cladding layers) is formed.

Next, an uncured layer for forming a core is formed by applying, onto the undercladding layer, a core layer-forming material (photosensitive varnish) obtained by dissolving the photosensitive resin composition of the embodiment of the present invention in an organic solvent. At this time, after having been applied, the core layer-forming material (photosensitive varnish) is formed into a film shape serving as an uncured photocurable film for forming an optical waveguide core layer by heating and drying the organic solvent to remove the solvent. Then, a photomask for exposing a predetermined pattern (optical waveguide pattern) is arranged on the surface of the uncured layer for forming a core, and the surface is irradiated with light, such as ultraviolet light, through the photomask and subjected to a heat treatment as required. After that, the core layer of the predetermined pattern is formed by dissolving and removing the unexposed portion of the uncured layer for forming a core with a developing solution.

Next, the photosensitive varnish formed of the photosensitive resin composition serving as the cladding layer-forming material is applied onto the core layer. After that, the overcladding layer (the upper portion of the cladding layers) is formed by irradiating the varnish with light, such as ultraviolet light, and subjecting the varnish to a heat treatment as required. The target optical waveguide can be produced through such steps.

A material for the base material is, for example, a silicon wafer, a metallic substrate, a polymer film, or a glass substrate. In addition, the metallic substrate is, for example, a stainless plate, such as SUS. In addition, the polymer film is specifically, for example, a polyethylene terephthalate (PET) film, a polyethylene naphthalate film, or a polyimide film. In addition, its thickness is typically set to fall within the range of from 10 μm to 3 mm.

In the light irradiation, ultraviolet irradiation is specifically performed. A light source for ultraviolet light in the ultraviolet irradiation is, for example, a low-pressure mercury lamp, a high-pressure mercury lamp, or an ultra-high pressure mercury lamp. In addition, the dose of the ultraviolet light is, for example, typically from 10 mJ/cm$^2$ to 20,000 mJ/cm$^2$, preferably from 100 mJ/cm$^2$ to 15,000 mJ/cm$^2$, more preferably from about 500 mJ/cm$^2$ to about 10,000 mJ/cm$^2$.

After the exposure by the ultraviolet irradiation, a heat treatment may be further performed for completing curing by a photoreaction. In ordinary cases, the heat treatment is performed under the conditions of a temperature in the range of from 80° C. to 250° C., preferably from 100° C. to 150° C. and a time in the range of from 10 seconds to 2 hours, preferably from 5 minutes to 1 hour.

In addition, an example of the cladding layer-forming material is a resin composition appropriately containing any of various liquid epoxy resins and solid epoxy resins, such as a bisphenol A-type epoxy resin, a bisphenol F-type epoxy resin, a hydrogenated bisphenol A-type epoxy resin, a fluorinated epoxy resin, and an epoxy-modified silicone resin, and any of the various photoacid generators described above. The resin composition is appropriately subjected to blending design for achieving a lower refractive index than that of the core layer-forming material. Further, so that the cladding layer-forming material may be prepared and applied as a varnish as required, various conventionally known organic solvents may each be used in an appropriate amount so that viscosity suitable for application may be obtained, and various additives (an antioxidant, an adhesiveness-imparting agent, a leveling agent, and a UV absorber) may each be used in an appropriate amount to the extent that the function of the optical waveguide using the core layer-forming material is not reduced.

As described above, examples of the organic solvent to be used for preparing the varnish include ethyl lactate, methyl ethyl ketone, cyclohexanone, ethyl lactate, 2-butanone, N,N-dimethylacetamide, diglyme, diethylene glycol methyl ethyl ether, propylene glycol methyl acetate, propylene glycol monomethyl ether, tetramethylfuran, and dimethoxyethane. One kind of those organic solvents is used alone, or two or more kinds thereof are used in combination, in an appropriate amount so that viscosity suitable for application may be obtained.

It should be noted that, for example, the following methods can each be employed as an application method involving using a material for forming each layer on the base material: an application method involving using a spin coater, a coater, a circular coater, a bar coater, or the like; a method involving forming a gap by means of screen printing or a spacer and injecting the material into the gap on the basis of a capillary phenomenon; and a method involving continuously applying the material with a coater, such as a multicoater, in a R-to-R fashion. In addition, the optical waveguide can be turned into a film-like optical waveguide by peeling and removing the base material.

The optical waveguide thus obtained can be used as, for example, an optical waveguide for a mixed flexible printed circuit board for optical/electrical transmission.

EXAMPLES

Next, the present invention is described by way of Examples. However, the present invention is not limited to these Examples. It should be noted that in Examples, the term "part(s)" means "part(s) by weight" unless otherwise stated.

Example 1

First, prior to the production of an optical waveguide serving as Example, respective photosensitive varnishes serving as a cladding layer-forming material and a core layer-forming material were prepared.

<Preparation of Cladding Layer-Forming Material>

Under a light-shielding condition, 50 parts of a liquid bifunctional fluoroalkyl epoxy resin (H022, manufactured by Tosoh F-Tech, Inc.), 50 parts of a liquid bifunctional alicyclic epoxy resin (CELLOXIDE 2021P, manufactured by Daicel Corporation), 4.0 parts of a photoacid generator (ADEKA OPTOMER SP-170, manufactured by ADEKA Corporation), 0.54 part of a phosphorus-based antioxidant (HCA, manufactured by Sanko Co., Ltd.), and 1 part of a silane coupling agent (KBM-403, manufactured by Shin-Etsu Silicone) were mixed, and were stirred and completely dissolved under heating at 80° C. After that, the solution was cooled to room temperature (25° C.), and was then filtered under heat and pressure with a membrane filter having a diameter of 1.0 μm to prepare a photosensitive varnish serving as a cladding layer-forming material.

<Preparation of Core Layer-Forming Material>

Under a light-shielding condition, 80 parts of a solid polyfunctional aliphatic epoxy resin (EHPE 3150, manufactured by Daicel Corporation), 20 parts of a solid hydrogenated bisphenol A-type epoxy resin (YX-8040, manufactured by Mitsubishi Chemical Corporation), 1.0 part of a photoacid generator (WPI-116, manufactured by Wako Pure Chemical Industries, Ltd.), 0.5 part of a hindered phenol-based antioxidant (Songnox 1010, manufactured by Kyodo Chemical Co., Ltd.), and 0.5 part of a phosphorus-based antioxidant (HCA, manufactured by Sanko Co., Ltd.) were mixed in 40 parts of ethyl lactate, and were stirred and completely dissolved under heating at 85° C. After that, the solution was cooled to room temperature (25° C.), and was then filtered under heat and pressure with a membrane filter having a diameter of 1.0 μm to prepare a photosensitive varnish serving as a core layer-forming material.

<<Production of Optical Waveguide>>
<Production of Undercladding Layer>

The photosensitive varnish serving as the cladding layer-forming material was applied onto a silicon wafer having a thickness of about 500 μm with a spin coater, followed by exposure to mixed beams (broad light) at 5,000 mJ (integrated at a wavelength of 365 nm). After that, the resultant was post-heated at 130° C. for 10 minutes to produce an undercladding layer (thickness: 20 μm).

<Production of Core Layer>

The photosensitive varnish serving as the core layer-forming material was applied onto the formed undercladding layer with a spin coater, and then the organic solvent (ethyl lactate) was dried (130° C.×5 minutes) on a hot plate. Thus, an uncured layer in an uncured film state was formed. The formed uncured layer was subjected to mask pattern exposure [pattern width/pattern interval (L/S)=50 μm/200 μm] to mixed beams (broad light) at 9,000 mJ (integrated at a wavelength of 365 nm), and was post-heated (140° C.×5 minutes). After that, the resultant was developed (25° C.×3 minutes) in N,N-dimethylacetamide (DMAc) and washed with water, and moisture was dried (120° C.×5 minutes) on a hot plate. Thus, a core layer of a predetermined pattern (thickness: 55 μm) was produced.

Thus, an optical waveguide in which the undercladding layer was formed on the silicon wafer and the core layer having the predetermined pattern was formed on the undercladding layer was produced.

Example 2

In the preparation of the photosensitive varnish serving as the core layer-forming material, the blending ratios of the resin components of the aliphatic resin were changed as follows: 75 parts of a solid polyfunctional aliphatic epoxy resin (EHPE 3150, manufactured by Daicel Corporation) and 25 parts of a solid hydrogenated bisphenol A-type epoxy resin (YX-8040, manufactured by Mitsubishi Chemical Corporation). An optical waveguide was produced in the same manner as in Example 1 except the foregoing.

Example 3

In the preparation of the photosensitive varnish serving as the core layer-forming material, the blending ratios of the resin components of the aliphatic resin were changed as follows: 67 parts of a solid polyfunctional aliphatic epoxy resin (EHPE 3150, manufactured by Daicel Corporation) and 33 parts of a solid hydrogenated bisphenol A-type epoxy resin (YX-8040, manufactured by Mitsubishi Chemical Corporation). An optical waveguide was produced in the same manner as in Example 1 except the foregoing.

Example 4

In the preparation of the photosensitive varnish serving as the core layer-forming material, the blending ratios of the resin components of the aliphatic resin were changed as follows: 50 parts of a solid polyfunctional aliphatic epoxy resin (EHPE 3150, manufactured by Daicel Corporation) and 50 parts of a solid hydrogenated bisphenol A-type epoxy resin (YX-8040, manufactured by Mitsubishi Chemical Corporation). An optical waveguide was produced in the same manner as in Example 1 except the foregoing.

Example 5

In the preparation of the photosensitive varnish serving as the core layer-forming material, the blending amount of the photoacid generator (WPI-116, manufactured by Wako Pure Chemical Industries, Ltd.) was changed to 3 parts. An optical waveguide was produced in the same manner as in Example 4 except the foregoing.

Example 6

In the preparation of the photosensitive varnish serving as the core layer-forming material, the blending amount of the photoacid generator (WPI-116, manufactured by Wako Pure Chemical Industries, Ltd.) was changed to 0.5 part. An optical waveguide was produced in the same manner as in Example 4 except the foregoing.

Comparative Example 1

In the preparation of the photosensitive varnish serving as the core layer-forming material, the blending composition of the resin components was changed as follows: 67 parts of a solid polyfunctional aliphatic epoxy resin (EHPE 3150, manufactured by Daicel Corporation) and 33 parts of a bisphenol A-type epoxy resin (YL-6810, manufactured by Mitsubishi Chemical Corporation). An optical waveguide was produced in the same manner as in Example 1 except the foregoing.

Comparative Example 2

In the preparation of the photosensitive varnish serving as the core layer-forming material, the blending ratios of the resin components were changed as follows: 67 parts of a cresol novolac-type polyfunctional epoxy resin (YDCN-700-10, manufactured by Nippon Steel & Sumikin Chemical Co., Ltd.) and 33 parts of a bisphenol A-type epoxy resin (YL-6810, manufactured by Mitsubishi Chemical Corporation). In addition, the photoacid generator was changed from WPI-116 (manufactured by Wako Pure Chemical Industries, Ltd.) to SP-170 (manufactured by ADEKA Corporation). An optical waveguide was produced in the same manner as in Example 1 except the foregoing.

A tackiness evaluation, a R-to-R compatibility (crack) evaluation, and a patterning property evaluation (the evaluations were each an evaluation concerning a core layer-forming material), and an optical waveguide loss evaluation (linear loss) and a reflow resistance evaluation (both were evaluations concerning an optical waveguide) were performed by using the respective photosensitive varnishes serving as the core layer-forming materials and the respective optical waveguides thus obtained in accordance with the following methods. The results of those evaluations are shown in Table 1 to be described later together with the blending compositions of the core layer-forming materials.

[Tackiness Evaluation]

Each of the photosensitive varnishes serving as the core layer-forming materials prepared in Examples and Comparative Examples described above was applied onto a silicon wafer having a thickness of about 500 μm with a spin coater, and was dried (130° C.×5 minutes) on a hot plate to produce an uncured film layer (thickness: about 50 μm).

Whether or not the surface of the resultant uncured film layer was tacky and rough was confirmed by a finger touch, and the result of the confirmation was evaluated on the basis of the following criteria.

○: The surface was free of tack and the roughening of the surface did not occur.

x: The surface had tack and the roughening of the surface occurred.

[R-to-R Compatibility (Crack) Evaluation]

Each of the photosensitive varnishes serving as the core layer-forming materials prepared in Examples and Comparative Examples described above was applied onto a SUS base material having a thickness of 50 μm with a spin coater, and was dried (130° C.×5 minutes) to produce an uncured film having a thickness of about 50 μm. The uncured film (amorphous film) formed on the SUS base material was wound around a winding core having a diameter of 8 cm, and the presence or absence of a crack occurring in the film was visually confirmed. The result of the confirmation was evaluated on the basis of the following criteria.

○: No crack occurred.

x: A crack occurred.

[Patterning Property Evaluation]

A core layer pattern formed on the undercladding layer by using each of the photosensitive varnishes serving as the core layer-forming materials prepared in Examples and Comparative Examples described above was observed with an optical microscope. The result of the observation was evaluated on the basis of the following criteria.

○: The shape of the core layer pattern was free of pattern waviness, tailing, and the like, and was a rectangular shape.

x: The shape of the core layer pattern was not a rectangular shape, and shape abnormality, such as pattern waviness or tailing, occurred.

[Optical Waveguide Loss Evaluation (Linear Loss)]

The photosensitive varnish serving as the cladding layer-forming material was applied onto each of the core layer patterns of the optical waveguides obtained by Examples and Comparative Examples described above with a spin coater, and was then prebaked (100° C.×5 minutes) on a hot plate. After that, the resultant was exposed to mixed beams (broad light) at 5,000 mJ (integrated at a wavelength of 365 nm), and was post-heated (120° C.×5 minutes) to form an over cladding layer. Thus, an optical waveguide (the thickness of the overcladding layer on the core layer pattern: 15 μm, the total thickness of the optical waveguide: 90 μm) was produced.

The optical waveguide was used as a sample, and light oscillated from a light source (850-nm VCSEL light source OP250, manufactured by Miki Inc.) was collected with a multimode fiber [FFP-G120-0500, manufactured by Miki Inc. (MMF having a diameter of 50 μm, NA=0.2)] and caused to enter the sample. Then, the light output from the sample was collected with a lens [FH14-11, manufactured by Seiwa Optical Co., Ltd. (magnification=20, NA=0.4)], and 4 channels of the light were evaluated with an optical measuring system (Optical Multipower Meter Q8221, manufactured by Advantest Corporation) by a cutback method. A linear loss was calculated from the average total loss of the 4 channels, and was evaluated on the basis of the following criteria.

○: The total linear loss was 0.04 dB/cm or less.

x: The result was that the total linear loss exceeded 0.04 dB/cm.

[Reflow Resistance Evaluation]

The optical waveguide was used as a sample and exposed to an heating step at a peak temperature of from 250° C. to 255° C. for 45 seconds with a reflow simulator (manufactured by Sanyoseiko, SMT Scope SK-5000) under an air atmosphere. After that, an evaluation for an optical waveguide loss (linear loss) was performed in the same manner as in the foregoing. The result of the evaluation was evaluated on the basis of the following criteria.

○: An increase in loss after the reflow heating was less than 0.01 dB/cm.

x: The result was that an increase in loss after the reflow heating exceeded 0.01 dB/cm.

TABLE 1

| | | Example | | | | | | Comparative Example (Part(s)) | |
|---|---|---|---|---|---|---|---|---|---|
| | | 1 | 2 | 3 | 4 | 5 | 6 | 1 | 2 |
| Aliphatic resin | EHPE 3150 | 80 | 75 | 67 | 50 | 50 | 50 | 67 | — |
| | YX-8040 | 20 | 25 | 33 | 50 | 50 | 50 | — | — |
| Aromatic resin | YDCN-700-10 | — | — | — | — | — | — | — | 67 |
| | YL-6810 | — | — | — | — | — | — | 33 | 33 |
| Photoacid generator | WPI-116 | 1 | 1 | 1 | 1 | 3 | 0.5 | 1 | — |
| | SP-170 | — | — | — | — | — | — | — | 1 |
| Antioxidant | Songnox 1010 | 0.5 | 0.5 | 0.5 | 0.5 | 0.5 | 0.5 | 0.5 | 0.5 |
| | HCA | 0.5 | 0.5 | 0.5 | 0.5 | 0.5 | 0.5 | 0.5 | 0.5 |
| Ethyl lactate (organic solvent) | | 40 | 40 | 40 | 40 | 40 | 40 | 40 | 40 |
| Tackiness | | ○ | ○ | ○ | ○ | ○ | ○ | ○ | ○ |
| R-to-R compatibility (crack) | | ○ | ○ | ○ | ○ | ○ | ○ | ○ | ○ |
| Patterning property | | ○ | ○ | ○ | ○ | ○ | ○ | ○ | ○ |
| Linear loss | | ○ | ○ | ○ | ○ | ○ | ○ | X | X |
| Reflow resistance | | ○ | ○ | ○ | ○ | ○ | ○ | ○ | ○ |

As can be seen from the foregoing results, a photosensitive resin composition obtained by using the solid polyfunctional aliphatic epoxy resin and the solid hydrogenated bisphenol A-type epoxy resin in combination (a product of Examples), and an optical waveguide including a core layer formed by using the photosensitive resin composition provided satisfactory evaluation results in all of the tackiness evaluation, the R-to-R compatibility (crack) evaluation, the patterning property evaluation, the optical waveguide loss evaluation (linear loss), and the reflow resistance evaluation.

In contrast, the photosensitive resin composition using the bisphenol A-type epoxy resin serving as an aromatic resin together with the solid polyfunctional aliphatic epoxy resin (the product of Comparative Example 1), and the photosensitive resin composition using the cresol novolac-type polyfunctional epoxy resin and the bisphenol A-type epoxy resin (the product of Comparative Example 2), and an optical waveguide including a core layer formed by using each of the photosensitive resin compositions provided satisfactory results in the tackiness evaluation, the R-to-R compatibility (crack) evaluation, the patterning property evaluation, and the reflow resistance evaluation, but an evaluation result obtained in the optical waveguide loss evaluation (linear loss) was poor.

A specific mode in the present invention has been described in Examples described above, but Examples described above are merely illustrative and should not be construed as being limitative. Various modifications apparent to a person skilled in the art are meant to fall within the scope of the present invention.

The optical waveguide photosensitive resin composition of the present invention is useful as a material for forming a component of an optical waveguide, in particular, a core layer-forming material. In addition, an optical waveguide produced by using the optical waveguide photosensitive resin composition is used in, for example, a mixed flexible printed circuit board for optical/electrical transmission.

What is claimed is:

1. An optical waveguide photosensitive resin composition, comprising:
    an aliphatic resin having a polymerizable substituent; and
    a photopolymerization initiator,
    wherein the aliphatic resin having the polymerizable substituent is formed of the following (A) and (B):
    (A) a side-chain polyfunctional aliphatic resin; and
    (B) a bifunctional long-chain aliphatic resin.

2. The optical waveguide photosensitive resin composition according to claim 1, wherein the polymerizable substituent comprises a cationically polymerizable substitutent.

3. The optical waveguide photosensitive resin composition according to claim 1, wherein a mixing weight ratio [(A):(B)] between the side-chain polyfunctional aliphatic resin (A) and the bifunctional long-chain aliphatic resin (B) satisfies a relationship of (A):(B)=4:1 to 1:1.

4. The optical waveguide photosensitive resin composition according to claim 1, wherein the aliphatic resin having the polymerizable substituent is in a solid state at 25° C.

5. The optical waveguide photosensitive resin composition according to claim 1, wherein the photopolymerization initiator is a photoacid generator represented by the following general formula (1):

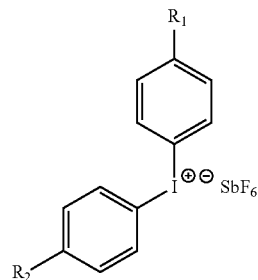

in the formula (1), $R_1$ and $R_2$ each represent hydrogen or an alkyl group having 1 to 15 carbon atoms, and may be identical to or different from each other.

6. The optical waveguide photosensitive resin composition according to claim 1, wherein the optical waveguide photosensitive resin composition is a core layer-forming material in an optical waveguide including a base material, a cladding layer formed on the base material, and a core layer configured to propagate an optical signal, the core layer being formed within the cladding layer in a predetermined pattern.

7. A photocurable film for forming an optical waveguide core layer, which is obtained by forming the optical waveguide photosensitive resin composition of claim 1 into a film shape.

8. An optical waveguide, comprising:
    a base material;
    a cladding layer formed on the base material; and
    a core layer configured to propagate an optical signal, the core layer being formed within the cladding layer in a predetermined pattern,
    wherein the core layer is formed by curing the optical waveguide photosensitive resin composition of claim 1.

9. An optical waveguide, comprising:
    a base material;
    a cladding layer formed on the base material; and
    a core layer configured to propagate an optical signal, the core layer being formed within the cladding layer in a predetermined pattern,
    wherein the core layer is formed by curing the photocurable film of claim 7.

10. A mixed flexible printed circuit board for optical/electrical transmission, comprising the optical waveguide of claim 8.

11. A mixed flexible printed circuit board for optical/electrical transmission, comprising the optical waveguide of claim 9.

* * * * *